(12) United States Patent
Ito

(10) Patent No.: US 7,965,146 B2
(45) Date of Patent: Jun. 21, 2011

(54) CONSTANT-TEMPERATURE TYPE CRYSTAL OSCILLATOR

(75) Inventor: Manabu Ito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 58 days.

(21) Appl. No.: 12/574,006

(22) Filed: Oct. 6, 2009

(65) Prior Publication Data

US 2010/0085125 A1 Apr. 8, 2010

(30) Foreign Application Priority Data

Oct. 8, 2008 (JP) ................. 2008-261426

(51) Int. Cl.
*H03L 1/04* (2006.01)
(52) U.S. Cl. ........................................ 331/70; 331/158
(58) Field of Classification Search .............. 331/70, 331/107 R, 116 R, 116 FE, 154, 158, 176; 257/731; 310/318, 348
See application file for complete search history.

(56) References Cited

U.S. PATENT DOCUMENTS

| | | | |
|---|---|---|---|
| 7,821,346 B2 * | 10/2010 | McCracken | 331/69 |
| 2005/0122547 A1 | 6/2005 | Yamanaka | |
| 2005/0258913 A1 * | 11/2005 | Ito et al. | 331/158 |
| 2006/0214743 A1 | 9/2006 | Arai et al. | |

FOREIGN PATENT DOCUMENTS

| | | |
|---|---|---|
| JP | 2-076296 A | 3/1990 |
| JP | 2000-315916 | 11/2000 |
| JP | 2005-341191 | 12/2005 |
| JP | 2006-311496 | 11/2006 |
| JP | 2008-181922 A | 8/2008 |
| JP | 2008-186590 A | 8/2008 |
| JP | 2008-195835 A | 8/2008 |

* cited by examiner

*Primary Examiner* — Joseph Chang
*Assistant Examiner* — Jeffrey Shin
(74) *Attorney, Agent, or Firm* — Carrier Blackman & Associates, P.C.; Joseph P. Carrier; William D. Blackman

(57) ABSTRACT

A constant-temperature type crystal oscillator includes: a crystal unit; an oscillator output circuit; a temperature control circuit; and a circuit substrate, on which circuit elements are installed. A principal surface of the crystal unit is installed so as to face one side board plane of the circuit substrate with interposing a first heat conducting resin, and the heating resistors are installed to be thermally coupled to the crystal unit via a second heat conducting resin. The principal surface of the crystal unit adheres to the one side board plane of the circuit substrate with interposing the first heat conducting resin. The heating resistors are installed on the one side board plane of the circuit substrate so as to sandwich the lead wires including a portion between the pair of lead wires of the crystal unit, and the heating resistors surround an outer circumference of the crystal unit.

5 Claims, 4 Drawing Sheets

CONSTANT-TEMPERATURE TYPE CRYSTAL OSCILLATOR

This application claims priority from Japanese Patent Application No. 2008-261426 filed on Oct. 8, 2008, the entire subject matter of which is incorporated herein by reference.

BACKGROUND OF THE INVENTION

1. Field of the Invention

The invention relates to a technical field of a constant-temperature type crystal oscillator (hereinafter called constant-temperature type oscillator) using a lead type crystal unit, and in particular, to a constant-temperature type oscillator which can reduce height size thereof.

2. Description of the Related Art

Constant-temperature type oscillators keep the operational temperatures of their crystal units constant and improve the frequency stability even when an ambient temperature is changed. Therefore, the constant-temperature type oscillators are applied to wireless devices in communication facilities which are, for example, base stations. In recent years, in place of a traditional constant-temperature bath on which heating coils are wound, heating resistors are used as a heat source, to simplify a constant-temperature structure. As one of these, there is a constant-temperature type oscillator using a lead type crystal unit.

FIGS. 2A and 2B are diagrams for explanation of a related art constant-temperature type oscillator. FIG. 2A is a cross-sectional view of the related art constant-temperature type oscillator, and FIG. 2B is a circuit diagram thereof. FIGS. 3A and 3B are diagrams for explanation of a crystal unit of the related art constant-temperature type oscillator. FIG. 3A is a cross-sectional view thereof, and FIG. 3B is a frequency-temperature characteristic diagram thereof.

The constant-temperature type oscillator shown in FIGS. 2A and 2B includes a lead type crystal unit 1, respective circuit elements 4 forming an oscillator output circuit 2 and a temperature control circuit 3, and a circuit substrate 5 on which the circuit elements 4 including the crystal unit 1 are installed thereon. Then, the constant-temperature type oscillator is configured such that the circuit substrate 5 is held with lead wires 8 (so-called airtight terminals) which is made airtight with glass 6 of a base for oscillator (metal base) 7, and those are covered with a cover for oscillator (a metal cover) 9 by resistance welding or the like. In this case, the base for oscillator 7 and a flange 10 projecting on the outer circumference of the cover for oscillator 9 are bonded to hermetically encapsulate it.

As shown in FIG. 3A, in the crystal unit 1, both end parts of a leading electrode 1y extended from an excitation electrode 1x of a crystal element 1A are held by supporters 12a connected to a pair of lead wires (airtight terminals) 12 of a metal base 11. Then, the metal base 11 and a flange 14 of a metal cover 13 are bonded by resistance welding in the same way as described above, to hermetically encapsulate the crystal element 1A. The crystal element 1A is formed as, for example, an SC-cut crystal element or an AT-cut crystal element, and has the frequency-temperature characteristic that approximately 80° C. is an extreme value. For example, in an AT-cut crystal element, the frequency-temperature characteristic shows a cubic curve (curve A in FIG. 3B), and in an SC-cut crystal element, the frequency-temperature characteristic shows a quadratic curve (curve B in FIG. 3B). Incidentally, frequency deviation $\Delta f/f$ is plotted along the ordinate of the diagram, where f is a frequency at room temperature, and $\Delta f$ is a frequency difference from the frequency f at room temperature.

The oscillator output circuit 2 is composed of an oscillating stage 2a serving as an oscillator circuit and a buffering stage 2b having a buffer amplifier or the like. The oscillating stage 2a is formed as a Colpitts type circuit having an unillustrated voltage dividing capacitor and transistor for oscillation, that form a resonance circuit along with the crystal unit 1. Here, the oscillating stage 2a is formed as a voltage control type circuit having a voltage-controlled capacitative element 4Cv in an oscillatory loop, for example. In the drawing, Vcc is a power source, Vout is an output, and Vc is a control voltage.

In the temperature control circuit 3, a temperature sensing voltage Vt by a temperature sensing element (for example, thermistor) 4th and a resistor 4R1 is applied to one input terminal of an operational amplifier 40A, and a reference voltage Vr by resistors 4R2 and 4R3 is applied to the other input terminal. Then, a differential voltage between the reference voltage Vr and the temperature sensing voltage Vt is applied to the base of a power transistor 4Tr, and electric power from the power source Vcc is supplied to the chip resistors 4h (one example of heating resistors) (hereinafter called heating resistors 4h) serving as heating elements. According thereto, the electric power to the heating resistors 4h is controlled with a temperature-dependent resistance value of the temperature sensing element 4th, to keep the operational temperature of the crystal unit 1 constant. An operational temperature is to be approximately 80° C. which is a minimum value or a maximum value at room temperature or more, for example (see FIG. 3B).

As shown in FIG. 2A, the circuit substrate 5 is composed of, for example, a glass epoxy substrate, and an unillustrated circuit pattern is formed thereon, and the respective circuit elements 4 including the crystal unit 1 are installed on both principal surfaces. Then, the circuit substrate 5 is held by the lead wires 8 of the base for oscillator. In this example, the crystal unit 1, and the heating resistors 4h, the power transistor 4Tr, and the temperature sensing element 4th in the temperature control circuit 3 are installed on one side board plane of the circuit substrate 5. The one side board plane (bottom face) of the circuit substrate 5 is set at the side of the base for oscillator 7, and the other side board plane (top face) thereof is set at the side of the cover for oscillator 9.

The principal surface of the crystal unit 1 faces the one side board plane of the circuit substrate 5, to touch, for example, two heating resistors 4h installed on the central area of the circuit substrate. Then, the pair of lead wires 12 are bent to penetrate through the circuit substrate 5, to be firmly fixed at the other side board plane with an unillustrated solder or the like. The power transistor 4Tr is disposed at the outer side of the crystal unit 1, and the temperature sensing element 4th is installed between the heating resistors 4h. These crystal unit 1 and circuit elements 4h, 4Tr, and 4th are covered with heat conducting resin 15. Here, the voltage-controlled capacitative element 4Cv which is temperature-dependent to greatly vary its characteristic, is installed between the heating resistors 4h.

The other circuit elements 4 of the oscillator output circuit 2 and the temperature control circuit 3 are installed on the top face set as the other side board plane of the circuit substrate 5 and on the outer circumferential portion out of the area of the heat conducting resin 15 on the bottom face set as the one side board plane. In particular, the respective circuit elements 4 of the oscillating stage 2a having an affect on an oscillating frequency are disposed on the top face of the circuit substrate 5 facing the area covered with the heat conducting resin 15. Further, for example, an adjuster element such as a capacitor for adjusting oscillating frequency and the like is installed on the top face of the circuit substrate 5, which makes it easy to adjust oscillating frequency.

Then, for example, in the case in which an exchange work of a soldered capacitor or resistor serving as an adjuster element is needed, by composing the circuit substrate 5 of a glass epoxy substrate, the exchange work by soldering an adjuster element can be made easy. That is, since heat in soldering is accumulated by the glass epoxy, the soldering is made easy. For example, in the case in which the circuit substrate 5 is a ceramic substrate, heat is easily let out, which makes a soldering work in exchange of elements difficult.

Incidentally, JP-A-2000-315916, JP-A-2006-311496 and JP-A-2005-341191 each discloses a related art constant-temperature type oscillator.

However, in the constant-temperature type oscillator having the above-described configuration, the principal surface of the crystal unit 1 is disposed on the heating resistors 4h so as to touch those, which results in the problem that the oscillator is increased in height size. For this reason, as shown in FIG. 4, for example, the heating resistors are removed from the bottom face of the crystal unit 1, and a plurality of heating resistors are disposed so as to surround the outer circumference of the crystal unit. It is considered that the oscillator is reduced in height size by the configuration. Incidentally, the heating resistor 4th and the like are omitted in FIG. 4 for the sake of convenience.

However, in this case, since the flange 14 of the crystal unit 1 touches the circuit substrate 5 to be inclined, the projecting part of the flange becomes taller. Then, a load is applied to the flexural areas of the pair of lead wires, and, for example, cracks are generated in the glass at the airtight terminals or the like, which results in the problem that an installation work to the circuit substrate is made difficult. Moreover, the thickness of the heat conducting resin at the metal base side is increased, which results in the problem that heat conduction to the circuit substrate from the principal surface of the metal cover is made nonuniform.

SUMMARY OF THE INVENTION

An object of the invention is to provide a constant-temperature type oscillator, which can reduce height size thereof so as to improve workability thereof, and which can uniform a temperature distribution thereof.

According to a first aspect of the invention, there is provided A constant-temperature type crystal oscillator comprising: a crystal unit, in which a metal base from which a pair of lead wires are led out and a flange of a metal cover are bonded to hermetically encapsulate a crystal element; an oscillator output circuit comprising an oscillating stage and a buffering stage formed along with the crystal unit; a temperature control circuit that keeps an operational temperature of the crystal unit constant; and a circuit substrate, on which circuit elements of the crystal unit, the oscillator output circuit and the temperature control circuit are installed, wherein the temperature control circuit comprises heating resistors, a power transistor that supplies electric power to the heating resistors and a temperature sensing element that detects an operational temperature of the crystal unit, wherein a principal surface of the crystal unit is installed so as to face one side board plane of the circuit substrate with interposing a first heat conducting resin between the principal surface of the crystal unit and the one side board plane of the circuit substrate, and the heating resistors are installed to be adjacent to the crystal unit to be thermally coupled to the crystal unit via a second heat conducting resin, wherein the flange of the crystal unit is inserted into a groove provided in the circuit substrate, and the principal surface of the crystal unit adheres to the one side board plane of the circuit substrate with interposing the first heat conducting resin between the principal surface of the crystal unit and the one side board plane of the circuit substrate, and wherein the heating resistors are installed on the one side board plane of the circuit substrate so as to sandwich the lead wires including a portion between the pair of lead wires of the crystal unit, and the heating resistors surround an outer circumference of the crystal unit.

According to a second aspect of the invention, in the constant-temperature type crystal oscillator, wherein the first heat conducting resin is an adhesive resin sheet, and wherein the second heat conducting resin is formed so as to apply liquid resin to be cured.

According to a third aspect of the invention, in the constant-temperature type crystal oscillator, wherein a planar area of the circuit substrate, on which the crystal unit and the heating resistors are thermally coupled to one another with the second heat conducting resin, is set as a thermally coupled area, and wherein circuit elements of the oscillating stage are installed on the thermally coupled area on the other side board plane that is the opposite surface to the one side board plane of the circuit substrate.

According to a fourth aspect of the invention, in the constant-temperature type crystal oscillator, wherein the circuit substrate is composed of a glass epoxy substrate and is held by the lead wires of the base for oscillator, wherein a cover for oscillator is bonded to the base for oscillator to form an oscillator case, wherein the one side board plane of the circuit substrate on which the crystal unit is installed faces the base for oscillator, and wherein circuit elements for adjustment are installed on the other side board plane of the circuit substrate.

According to a fifth aspect of the invention, in the constant-temperature type crystal oscillator, wherein the temperature sensing element is installed on the one side board plane of the circuit substrate along with the crystal unit and the heating resistors so as to be thermally coupled to one another via the second heat conducting resin to form a thermally coupled area.

According to the aspects of the invention, since the flange of the crystal unit is inserted into the groove of the circuit substrate, the principal surface of the crystal unit (metal cover) is basically set in the horizontal direction to the one side board plane of the circuit substrate. Accordingly, it is possible to decrease the height in response to the projecting part of the flange. Then, a gap between the principal surface of the crystal unit and the one side board plane of the circuit substrate is minimized, and the thickness of the first heat conducting resin as well is reduced. According thereto, it is possible to maximize conductive heat from the principal surface of the metal cover to the circuit substrate, to uniform a temperature distribution of the circuit substrate. Further, at the time of installing the crystal unit to the circuit substrate, in particular, when the pair of lead wires are inserted through the circuit substrate to be connected thereto, the load applied to the flexural areas is reduced, which makes it possible to improve the workability.

According to the second aspect of the invention, since the first heat conducting resin is a resin sheet, it is possible to improve the workability more than the case in which liquid resin is applied as the first heat conducting resin.

According to the third aspect of the invention, in particular, since an operational temperature of the circuit elements of the oscillating stage having an affect on an oscillating frequency is stabilized, it is possible to prevent a frequency change according to a temperature property of these circuit elements.

According to the fourth aspect of the invention, for example, it is possible to easily adjust oscillating frequency. In particular, since the circuit substrate is composed of a glass epoxy substrate, when exchange of circuit elements for adjustment by de-installation is needed, it is possible to make a soldering work for the circuit elements easy.

According to the fifth aspect of the invention, since the chip resistors for heating (the heat source) (hereinafter called as heating resistors or heating chip resistors), the crystal unit, and the temperature sensing element are thermally coupled to one another, temperatures thereof are uniformed, which makes real-time temperature control possible.

BRIEF DESCRIPTION OF THE DRAWINGS

FIGS. 1A and 1B are diagrams for explanation of a constant-temperature type oscillator according to one embodiment of the invention, in which FIG. 1A is a schematic cross-sectional view of the constant-temperature type oscillator, and FIG. 1B is a plan view of one side board plane as a bottom face of a circuit substrate of the constant-temperature type oscillator;

FIGS. 2A and 2B are diagrams for explanation of a related art constant-temperature type oscillator, in which FIG. 2A is a cross-sectional view of the related art constant-temperature type oscillator, and FIG. 2B is a circuit diagram of the related art constant-temperature type oscillator;

FIGS. 3A and 3B are diagrams for explanation of a crystal unit of the related art constant-temperature type oscillator, in which FIG. 3A is a cross-sectional view of the crystal unit, and FIG. 3B is a frequency-temperature characteristic diagram of the crystal unit.

DETAILED DESCRIPTION OF THE PREFERRED EMBODIMENTS

Figure 1A:
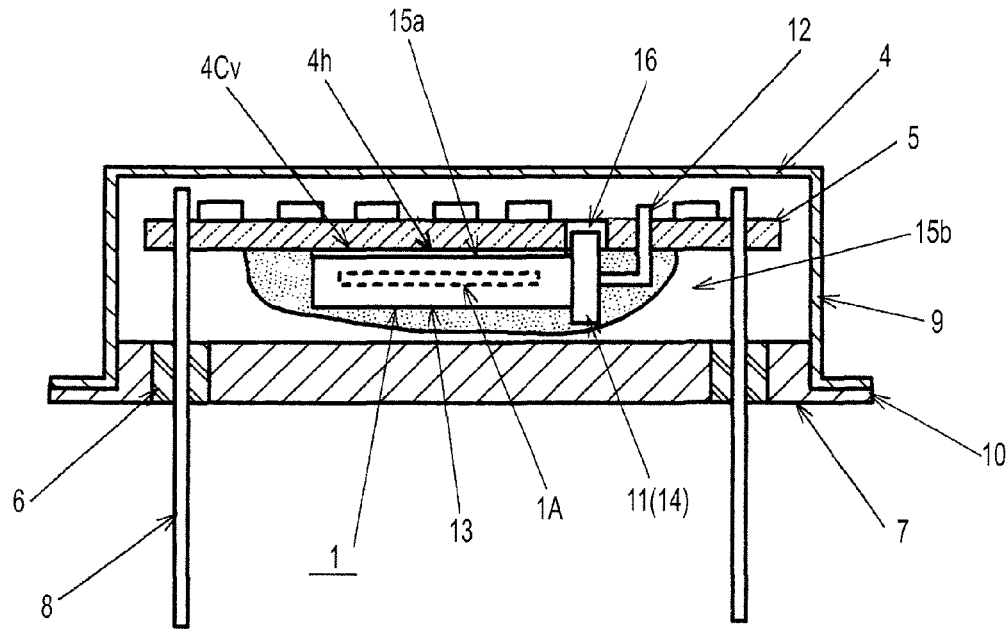
Figure 1B:
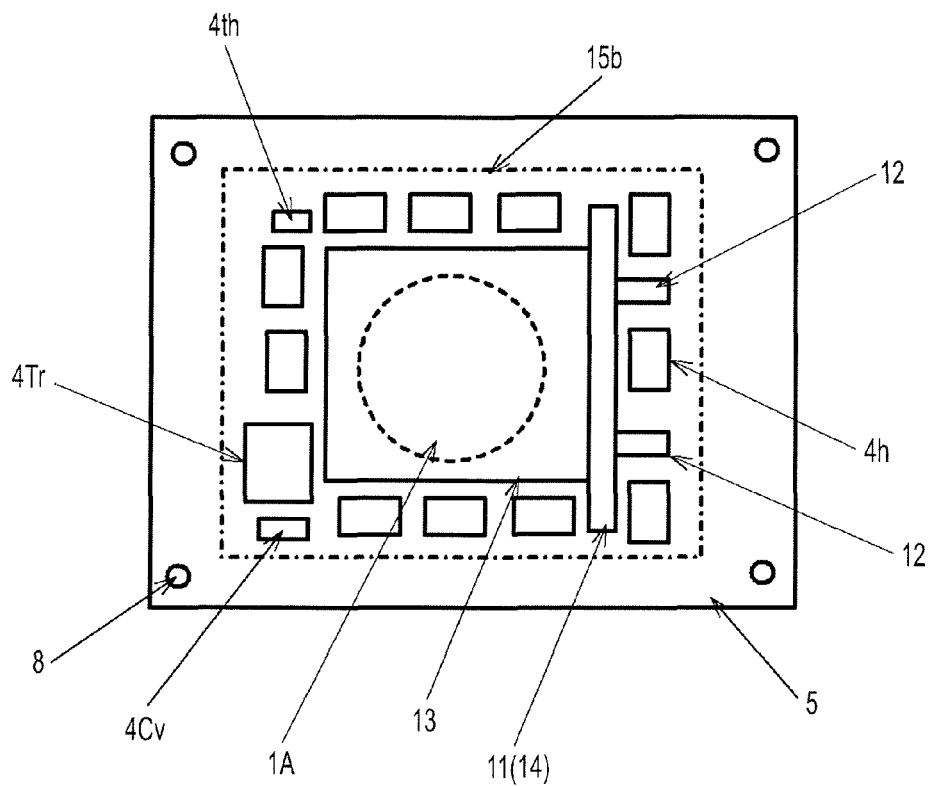

FIGS. 1A and 1B are diagrams for explanation of a constant-temperature type oscillator according to one embodiment of the invention. FIG. 1A is a schematic cross-sectional view thereof, and FIG. 1B is a plan view of one side board plane as a bottom face of a circuit substrate thereof.

Figure 2A:
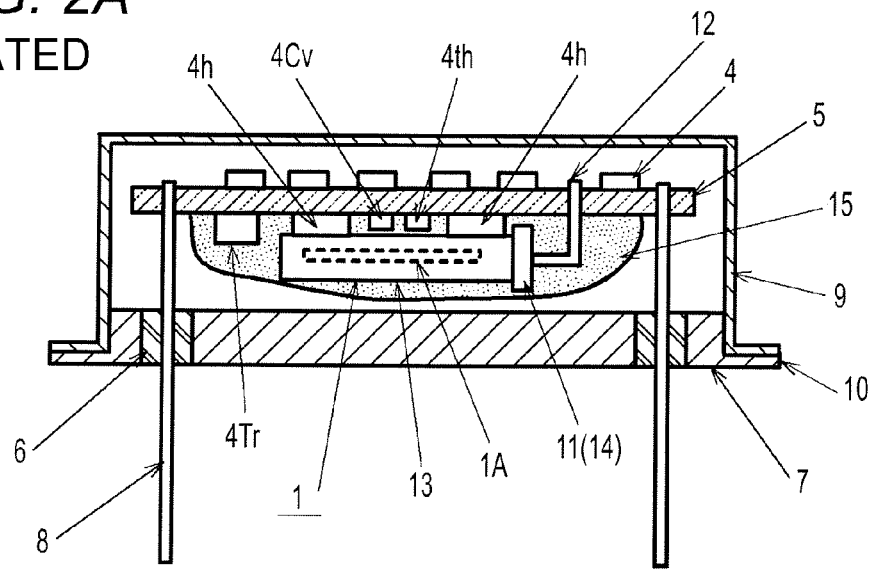
Figure 2B:
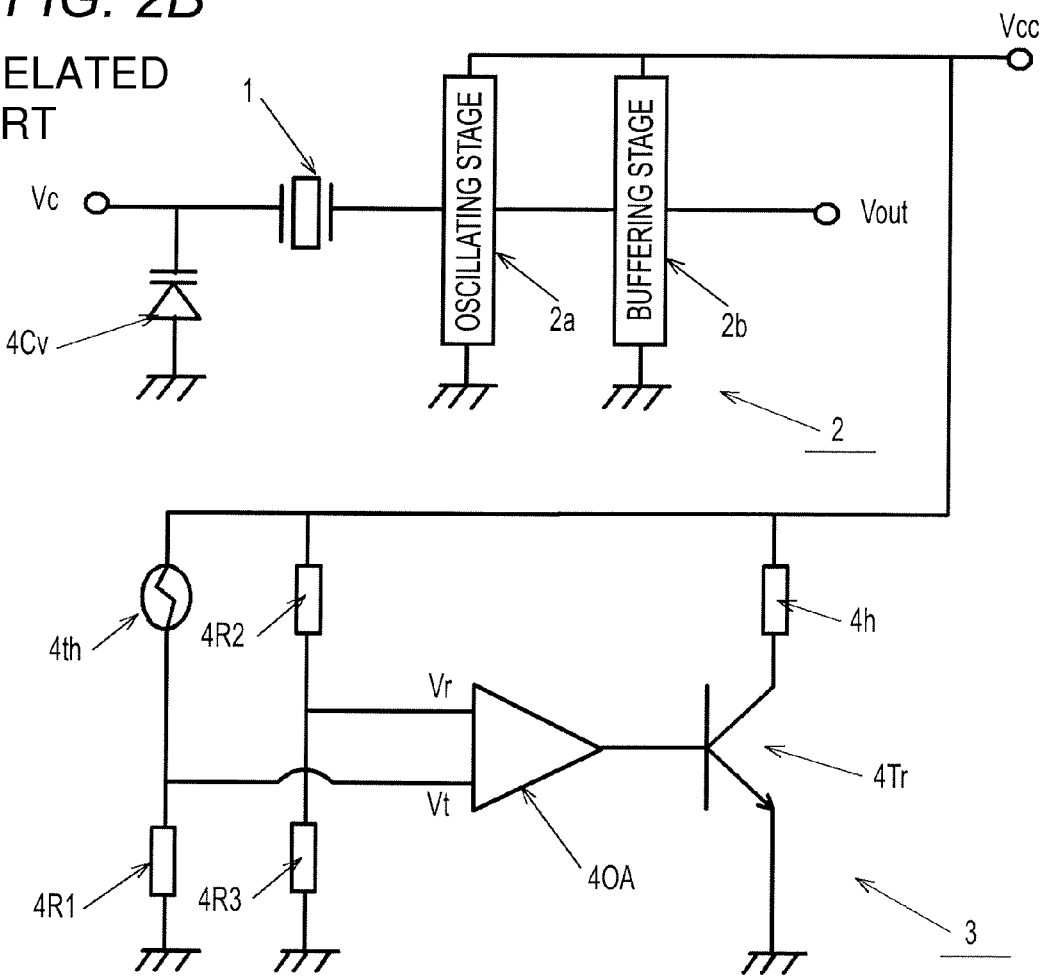
Figure 3A:
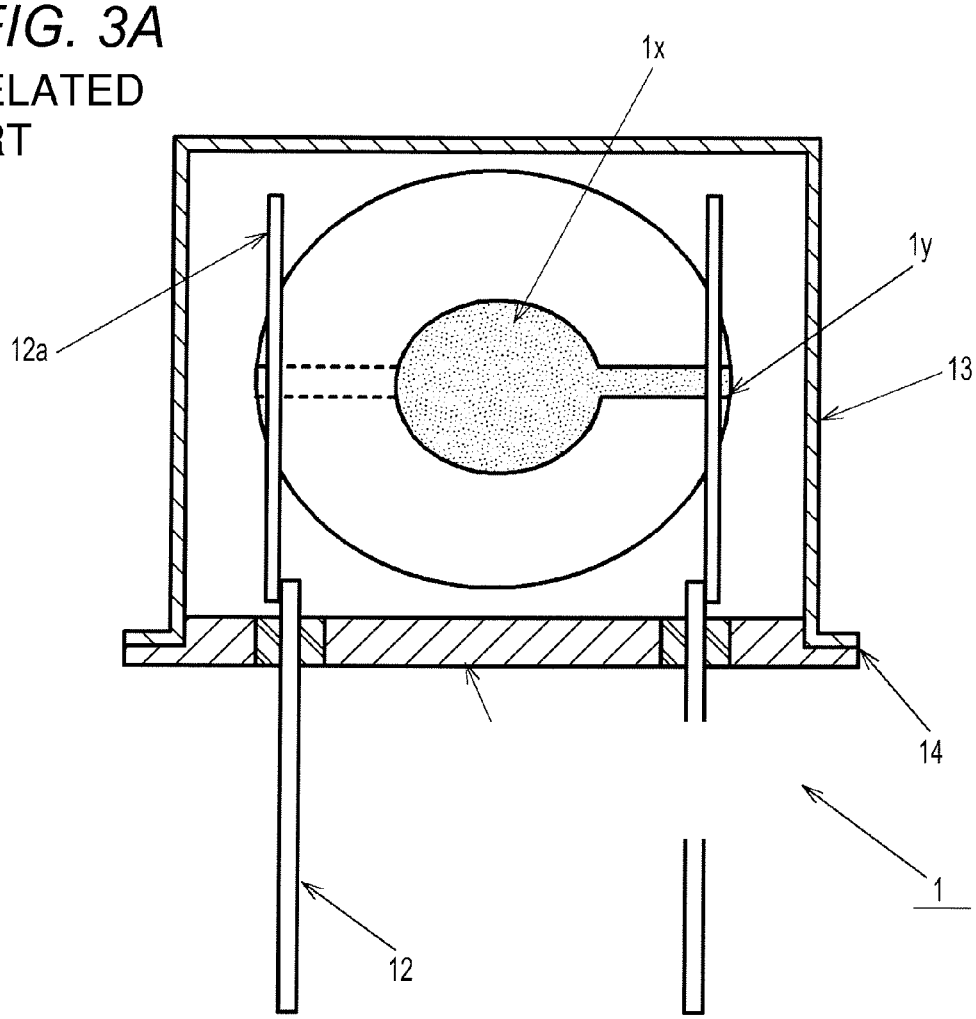
Figure 3B:
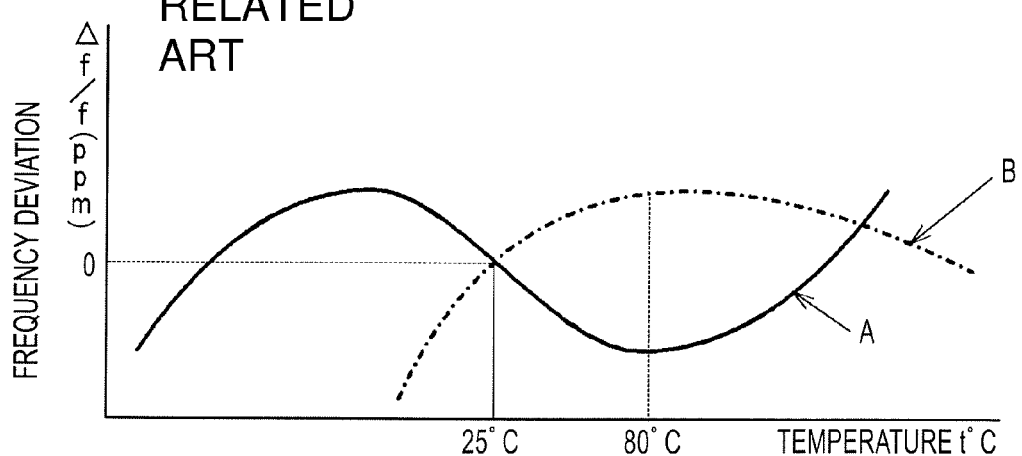
Figure 4:
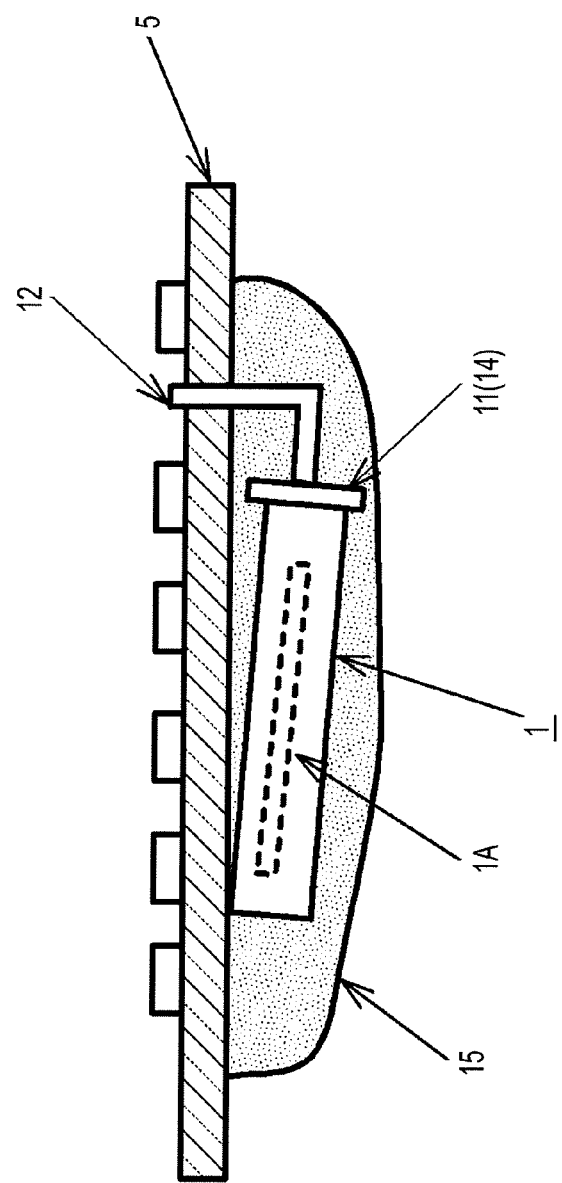
FIG. 4 is a schematic cross-sectional view of a circuit substrate of the related art constant-temperature type oscillator.

As described above, the constant-temperature type oscillator includes the crystal unit 1 in which the metal base 11 and the flange 14 of the metal cover 13 are bonded by resistance welding, to hermetically encapsulate the crystal element 1A, and from which the pair of lead wires 12 are led out (refer to FIG. 2A). The crystal unit 1 is installed on the central area as the one side board plane of the circuit substrate 5, to face the base for oscillator 7. Then, the pair of lead wires 12 are bent to penetrate through the leading ends thereof to be connected to the other side board plane with a solder. The circuit substrate 5 is held by the lead wires 8 of the base for oscillator 7, and the cover for oscillator 9 is bonded to the base for oscillator 7.

Here, a pass-through groove 16 is provided in the circuit substrate 5, and the flange 14 of the crystal unit 1 is inserted into the groove 16. The principal surface of the crystal unit 1 (the metal cover 13) is set in the horizontal direction to the one side board plane of the circuit substrate 5, to firmly adhere to the circuit substrate 5 by interposing first heat conducting resin 15a. The first heat conducting resin 15a is to be an adhesive resin sheet. Then, the heating resistors 4h are installed so as to surround the outer circumference of the crystal unit 1 on the one side board plane of the circuit substrate 5.

In detail, the heating resistors 4h are installed between the pair of lead wires 12 of the crystal unit 1 and at the outer sides of the pair of lead wires 12, to sandwich the respective lead wires 12. Then, the heating resistors 4h are installed to be adjacent to the outer circumference of the metal base 11 and the metal cover 13 so as to surround those. However, in this example, for example, the power transistor 4Tr serves as a heat source, and the temperature sensing element 4th and the voltage-controlled capacitative element 4Cv are further installed, for example, in the head area of the metal cover 13. Those are covered with second heat conducting resin 15b which is applied as liquid resin and is cured thereafter, and those are respectively thermally coupled to each other. Then, the planar area covered with the second heat conducting resin 15b is set as a thermally coupled area of the circuit substrate 5.

The other respective circuit elements 4 of the oscillator output circuit 2 and the temperature control circuit 3 are installed on the other side board plane which is the opposite surface of the one side board plane of the circuit substrate 5. In particular, the circuit elements 4 of the oscillating stage 2a having an affect on an oscillating frequency are installed on the thermally coupled area (the area to which the heat conducting resin 15b is applied), that is the other side board plane (top face), of the circuit substrate 5. Then, the circuit elements 4 of the buffering stage 2b and the temperature control circuit 3 are installed in the thermally coupled area and out of the thermally coupled area. In particular, the circuit elements 4 for adjusting oscillating frequency are installed on the top face (the other side board plane) of the circuit substrate 5 at the side of the cover for oscillator 9. Incidentally, the temperature control circuit 3 functions as a temperature compensation circuit of the crystal unit 1.

According to such a configuration, since the flange 14 of the crystal unit 1 is inserted into the groove 16 of the circuit substrate 5, the principal surface of the crystal unit 1 (the metal cover 13) is basically set in the horizontal direction to the one side board plane of the circuit substrate 5. Accordingly, it is possible to reduce the height in response to a projecting part of the flange 14. Then, a gap between the principal surface of the crystal unit 1 and the one side board plane of the circuit substrate 5 is minimized, and the thickness of the first heat conducting resin 15a as well is reduced.

According thereto, it is possible to maximize conductive heat from the principal surface of the metal cover 13 to the circuit substrate 5, and to uniform a temperature distribution of the circuit substrate 5. Further, at the time of installing the crystal unit 1 to the circuit substrate 5, in particular, when the pair of lead wires 12 are inserted through the circuit substrate 5 to be connected thereto, the load applied to the flexural areas is reduced, which makes it possible to improve the workability.

Further, since the first heat conducting resin 15a is to be an adhesive resin sheet, it is possible to improve the workability more than the case in which liquid resin is applied as the first heat conducting resin 15a. Further, the circuit elements 4 of the oscillating stage 2a having an affect on an oscillating frequency are installed on the other side board plane of the circuit substrate 5, which is set as a thermally coupled area by applying the second heat conducting resin 15b thereto. Accordingly, since an operational temperature of the circuit elements 4 of the oscillating stage 2a as well is stabilized, it is possible to prevent a frequency change according to a temperature property of these circuit elements.

Further, since the circuit elements 4 for adjustment are installed on the top face at the side of the cover for oscillator 9 of the circuit substrate 5, it is possible to easily adjust an oscillating frequency, for example. In particular, in the case in which the circuit substrate 5 is composed of a glass epoxy substrate, when exchange of the circuit elements 4 for adjustment by de-installation is needed, it is possible to prevent heat radiation, to make the soldering work easy.

Further, in this example, the heating resistors 4*h* and the power transistor 4Tr serving as a heat source, the crystal unit 1, and the temperature sensing element 4*th* are thermally coupled to one another with the second heat conducting resin, that is set as a thermally coupled area. Accordingly, specifically, temperatures of the heat source, the crystal unit 1, and the temperature sensing element are uniformed, which makes real-time temperature control possible.

In the above-described embodiment, the power transistor 4Tr is arrayed on the outer circumference of the crystal unit 1 along with the heating resistors 4*h*. Alternatively, the power transistor 4Tr may be arrayed at the outer side of the heating resistors 4*h*. In this case, for example, it is possible to eliminate nonuniformity in temperature distribution due to a difference in heat quantities of the power transistor 4Tr and the respective heating resistors 4*h*. Incidentally, if the power transistor 4Tr is disposed at the outer side of the second heat conducting resin 15*b* to be excluded from the heat source, the uniformity of temperature distribution is further improved. However, since energy as a heat source is wasted, this mode is selected as needed.

Further, the second heat conducting resin 15*b* covers the crystal unit, the heating resistors 4*h*, and the temperature sensing element 4*th*. However, it suffices to fill a space among these respective elements (1, 4*h*, 4*th*, and the like) with the second heat conducting resin 15*b*, to make those be thermally coupled to one another, and it is not necessarily that the respective elements are covered from above with the second heat conducting resin 15*b*.

What is claimed is:

1. A constant-temperature type crystal oscillator comprising:
    a crystal unit, in which a metal base from which a pair of lead wires are led out and a flange of a metal cover are bonded to hermetically encapsulate a crystal element;
    an oscillator output circuit comprising an oscillating stage and a buffering stage formed along with the crystal unit;
    a temperature control circuit that keeps an operational temperature of the crystal unit constant; and
    a circuit substrate, on which circuit elements of the crystal unit, the oscillator output circuit and the temperature control circuit are installed,
    wherein the temperature control circuit comprises heating resistors, a power transistor that supplies electric power to the heating resistors and a temperature sensing element that detects an operational temperature of the crystal unit,
    wherein a principal surface of the crystal unit is installed so as to face one side board plane of the circuit substrate with interposing a first heat conducting resin between the principal surface of the crystal unit and the one side board plane of the circuit substrate, and the heating resistors are installed to be adjacent to the crystal unit to be thermally coupled to the crystal unit via a second heat conducting resin,
    wherein the flange of the crystal unit is inserted into a groove provided in the circuit substrate, and the principal surface of the crystal unit adheres to the one side board plane of the circuit substrate with interposing the first heat conducting resin between the principal surface of the crystal unit and the one side board plane of the circuit substrate, and
    wherein the heating resistors are installed on the one side board plane of the circuit substrate so as to sandwich the lead wires including a portion between the pair of lead wires of the crystal unit, and the heating resistors surround an outer circumference of the crystal unit.

2. The constant-temperature type crystal oscillator according to claim 1,
    wherein the first heat conducting resin is an adhesive resin sheet, and
    wherein the second heat conducting resin is formed so as to apply liquid resin to be cured.

3. The constant-temperature type crystal oscillator according to claim 1,
    wherein a planar area of the circuit substrate, on which the crystal unit and the heating resistors are thermally coupled to one another with the second heat conducting resin, is set as a thermally coupled area, and
    wherein circuit elements of the oscillating stage are installed on the thermally coupled area on the other sideboard plane that is the opposite surface to the one side board plane of the circuit substrate.

4. The constant-temperature type crystal oscillator according to claim 1,
    wherein the circuit substrate is composed of a glass epoxy substrate and is held by the lead wires of the base for oscillator,
    wherein a cover for oscillator is bonded to the base for oscillator to form an oscillator case,
    wherein the one side board plane of the circuit substrate on which the crystal unit is installed faces the base for oscillator, and
    wherein circuit elements for adjustment are installed on the other side board plane of the circuit substrate.

5. The constant-temperature type crystal oscillator according to claim 1,
    wherein the temperature sensing element is installed on the one side board plane of the circuit substrate along with the crystal unit and the heating resistors so as to be thermally coupled to one another via the second heat conducting resin to form a thermally coupled area.

* * * * *